(12) United States Patent
Dastouri et al.

(10) Patent No.: US 11,493,852 B2
(45) Date of Patent: Nov. 8, 2022

(54) NOISE CORRECTION FOR ALIGNMENT SIGNAL

(71) Applicant: ASML Holding N.V., Veldhoven (NL)

(72) Inventors: Zahrasadat Dastouri, Norwalk, CT (US); Greger Göte Andersson, Redding, CT (US); Krishanu Shome, Cheshire, CT (US); Igor Matheus Petronella Aarts, Port Chester, NY (US)

(73) Assignee: ASML Holdings N.V., Velhoven (NL)

( * ) Notice: Subject to any disclaimer, the term of this patent is extended or adjusted under 35 U.S.C. 154(b) by 0 days.

(21) Appl. No.: 17/415,711

(22) PCT Filed: Dec. 12, 2019

(86) PCT No.: PCT/EP2019/084870
§ 371 (c)(1),
(2) Date: Jun. 17, 2021

(87) PCT Pub. No.: WO2020/126816
PCT Pub. Date: Jun. 25, 2020

(65) Prior Publication Data
US 2022/0066334 A1 Mar. 3, 2022

Related U.S. Application Data

(60) Provisional application No. 62/784,010, filed on Dec. 21, 2018.

(51) Int. Cl.
*G03F 9/00* (2006.01)
(52) U.S. Cl.
CPC .......... *G03F 9/7049* (2013.01); *G03F 9/7092* (2013.01)

(58) Field of Classification Search
CPC ..... G03F 9/7049; G03F 9/7092; G03F 9/7088
See application file for complete search history.

(56) References Cited

U.S. PATENT DOCUMENTS

| 6,064,486 A | 5/2000 | Chen et al. |
| 8,617,774 B2 | 12/2013 | Kerwien et al. |

(Continued)

FOREIGN PATENT DOCUMENTS

| CN | 101634810 A | 1/2010 |
| CN | 107462176 A | 12/2017 |

(Continued)

OTHER PUBLICATIONS

International Search Report and Written Opinion of the International Searching Authority directed to related International Patent Application No. PCT/EP2019/084870, dated May 26, 2020; 11 pages.

(Continued)

*Primary Examiner* — Peter B Kim
(74) *Attorney, Agent, or Firm* — Sterne, Kessler, Goldstein & Fox P.L.L.C.

(57) ABSTRACT

A method of applying a measurement correction includes determining an orthogonal subspace used to characterize the measurement as a plot of data. A first axis of the orthogonal subspace corresponds to constructive interference output from an interferometer of the metrology system plus a first error variable and a second axis of the orthogonal subspace corresponds to destructive interference output from the interferometer of the metrology system plus a second error variable. The method also includes determining a slope of the plot of data and determining a fitted line to the plot of data in the orthogonal subspace based on the slope.

14 Claims, 13 Drawing Sheets

(56) References Cited

U.S. PATENT DOCUMENTS

| | | |
|---|---|---|
| 8,902,431 B2 | 12/2014 | Liesener et al. |
| 10,466,601 B2 | 11/2019 | Polo et al. |
| 2004/0033426 A1 | 2/2004 | Den Boef et al. |
| 2006/0147815 A1 | 7/2006 | Melvin, III |
| 2013/0155413 A1 | 6/2013 | Liesener et al. |

FOREIGN PATENT DOCUMENTS

| | | | |
|---|---|---|---|
| JP | 2011-508241 A | 3/2011 | |
| JP | 2018-529104 A | 10/2018 | |
| TW | 2011-09837 A | 3/2011 | |
| WO | WO 2008/076979 A1 | 6/2008 | |
| WO | WO-2018001972 A1 * | 1/2018 | ......... G01B 11/2504 |
| WO | WO 2018/210505 A1 | 11/2018 | |
| WO | WO-2020114829 A1 * | 6/2020 | ......... G03F 7/70633 |

OTHER PUBLICATIONS

International Preliminary Report on Patentability directed to related International Patent Application No. PCT/EP2019/084870, dated Jun. 16, 2021; 8 pages.

\* cited by examiner

NOISE CORRECTION FOR ALIGNMENT SIGNAL

CROSS-REFERENCE TO RELATED APPLICATIONS

This application claims priority of U.S. Provisional Patent Application No. 62/784,010, which was filed on Dec. 21, 2018, and which is incorporated herein in its entirety by reference.

FIELD

The present disclosure relates to metrology systems that may be used, for example, in a lithographic apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use a metrology system for detecting positions of the alignment marks (e.g., X and Y position) and for aligning the substrate using the alignment marks to ensure accurate exposure from a mask. The metrology system may be used to determine a height of a wafer surface in the Z direction. It can be challenging to account for noise variation in the received signal from the alignment marks. Current noise correction strategies are not accurate enough and still lead to overlay mismatches, especially as feature sizes on the substrate become smaller and smaller.

SUMMARY

Accordingly, there is a need for improving metrology systems to perform better wafer alignment by using better noise correction methodologies.

According to an embodiment, a metrology system includes a radiation source that generates light, a reflector, an interferometer, a detector, and a controller. The reflector directs at least a portion of the light towards a substrate. The interferometer interferes the light that has been diffracted from a pattern on the substrate, or reflected from the substrate, and produces output light from the interference. The detector receives the output light from the interferometer and produces a measurement based on the received output light. The controller determines a correction to the measurement. The determination includes determining an orthogonal subspace used to characterize the measurement as a plot of data. A first axis of the orthogonal subspace corresponds to constructive interference output from the interferometer plus a first error variable and a second axis of the orthogonal subspace corresponds to destructive interference output from the interferometer plus a second error variable. The controller also determines a slope of the plot of data, and determines a fitted line to the plot of data in the orthogonal subspace based on the slope.

In another embodiment, a lithographic apparatus includes an illumination system designed to illuminate a pattern of a patterning device, a projection system that projects an image of the pattern onto a target portion of a substrate, and a metrology system. The metrology system includes a radiation source that generates light, a reflector, an interferometer, a detector, and a controller. The reflector directs at least a portion of the light towards a substrate. The interferometer interferes the light that has been diffracted from a pattern on the substrate, or reflected from the substrate, and produces output light from the interference. The detector receives the output light from the interferometer and produces a measurement based on the received output light. The controller determines a correction to the measurement. The determination includes determining an orthogonal subspace used to characterize the measurement as a plot of data. A first axis of the orthogonal subspace corresponds to constructive interference output from the interferometer plus a first error variable and a second axis of the orthogonal subspace corresponds to destructive interference output from the interferometer plus a second error variable. The controller also determines a slope of the plot of data, and determines a fitted line to the plot of data in the orthogonal subspace based on the slope.

In yet another embodiment, a method of applying a measurement correction includes determining an orthogonal subspace used to characterize the measurement as a plot of data. A first axis of the orthogonal subspace corresponds to constructive interference output from an interferometer of the metrology system plus a first error variable and a second axis of the orthogonal subspace corresponds to destructive interference output from the interferometer of the metrology system plus a second error variable. The method also includes determining a slope of the plot of data and determining a fitted line to the plot of data in the orthogonal subspace based on the slope.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 10:
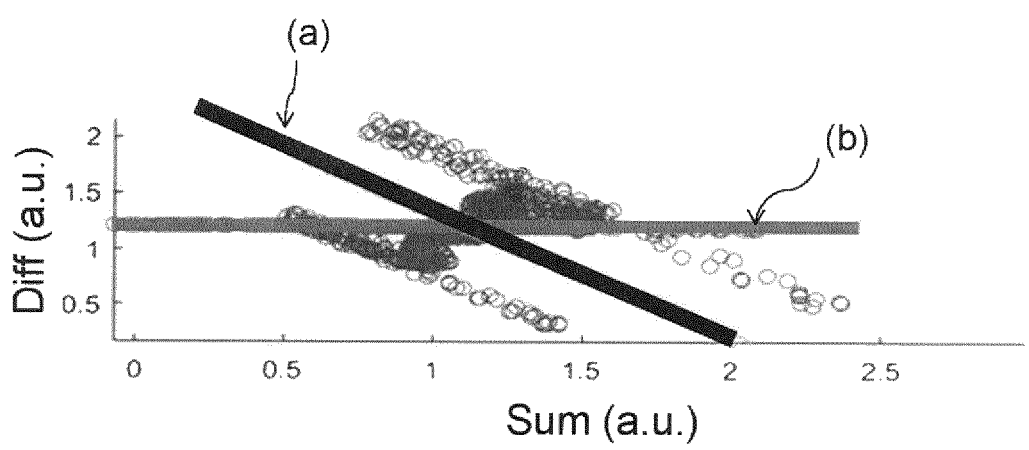

FIG. 10 compares different techniques for fitting a line to collected data, according to an embodiment.

Figure 11:
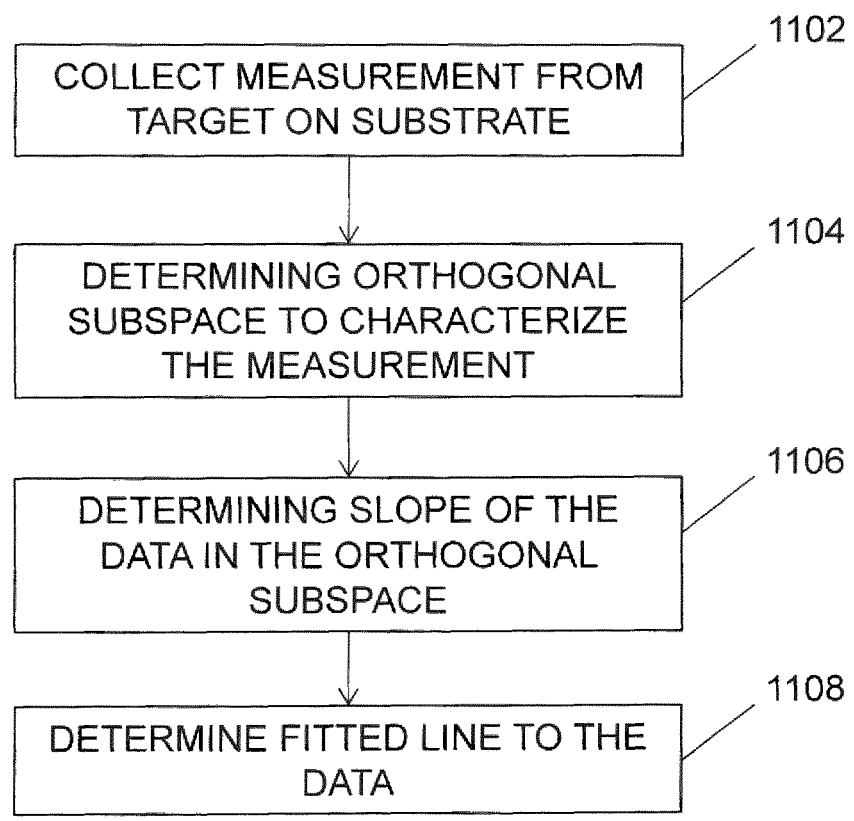

FIG. 11 is an example flowchart of operations performed to correct for noise in measured data, according to an embodiment.

Figure 12:
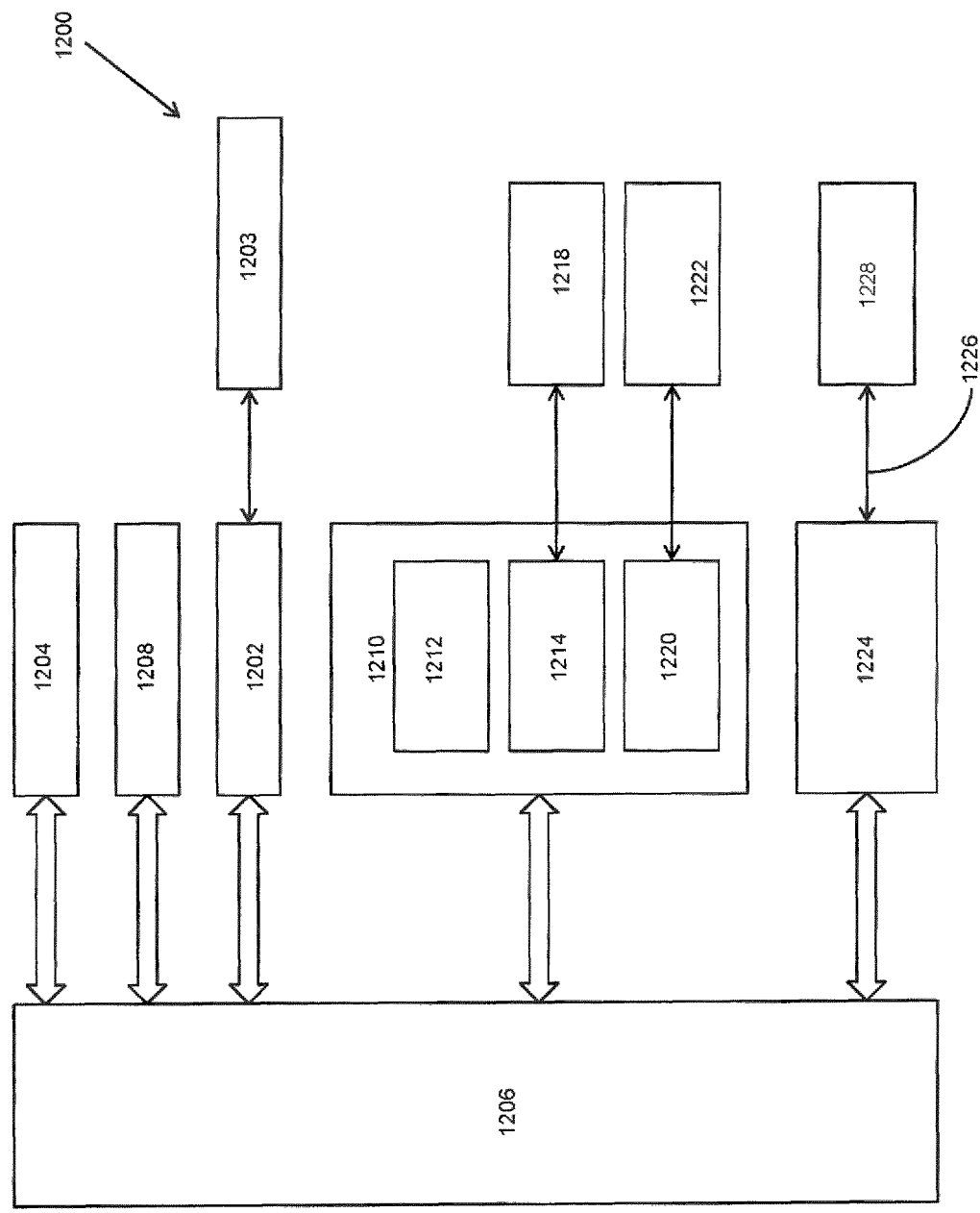

FIG. 12 is an example computer system useful for implementing various embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1A:
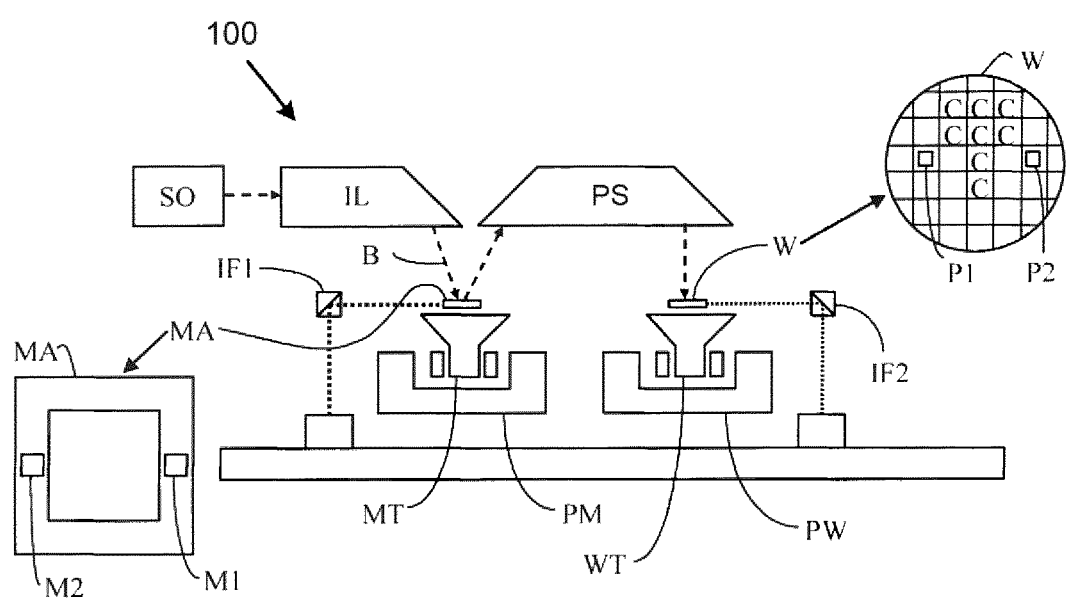
FIG. 1A is an illustration of a reflective lithographic apparatus according to an embodiment.
Figure 1B:
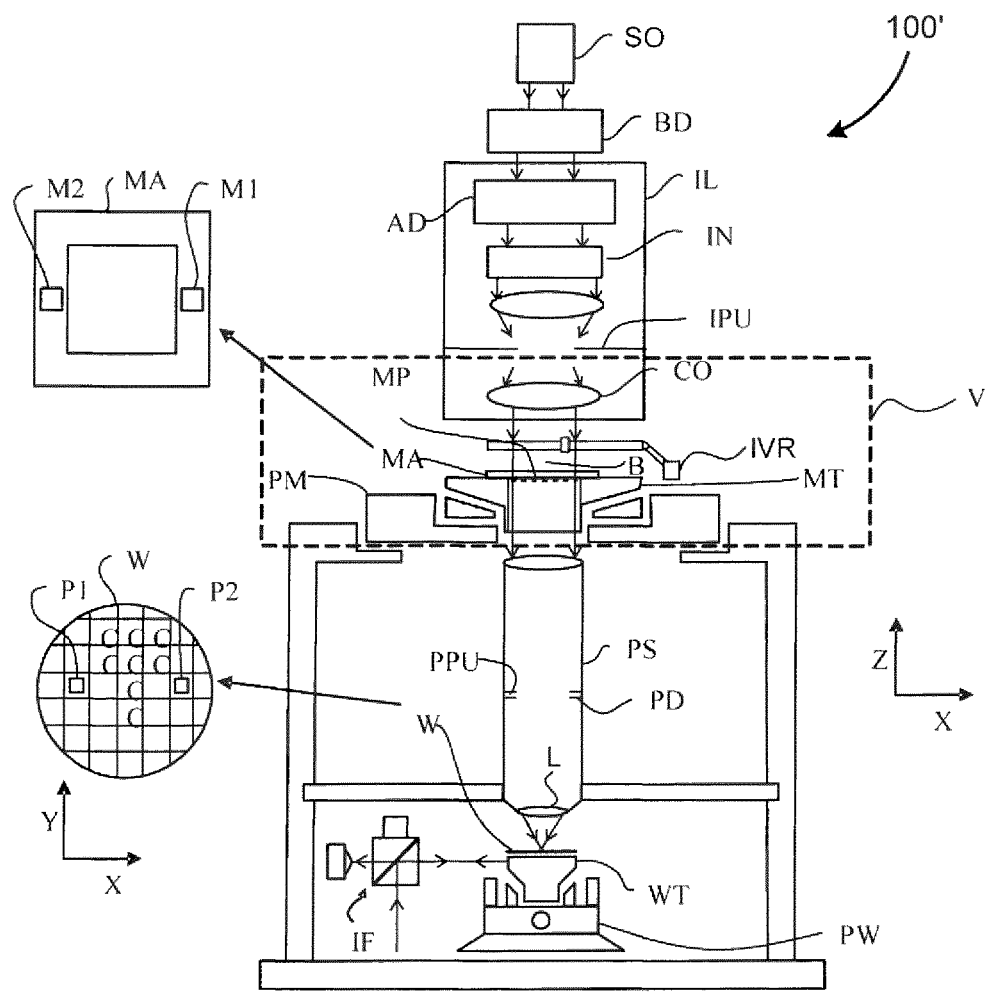
FIG. 1B is an illustration of a transmissive lithographic apparatus according to an embodiment.

FIGS. 1A and 1B are illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
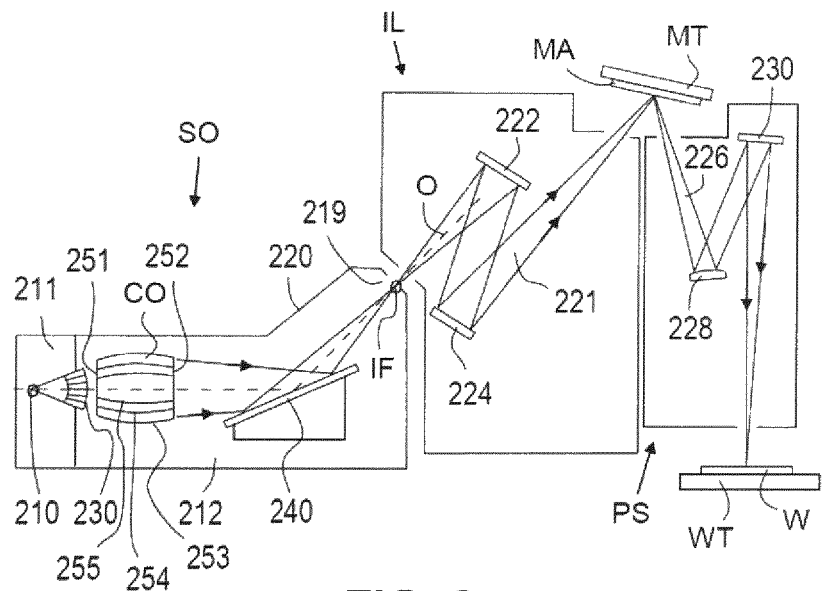
FIG. 2 is a more detailed illustration of the reflective lithographic apparatus, according to an embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Example Lithographic Cell

Figure 3:
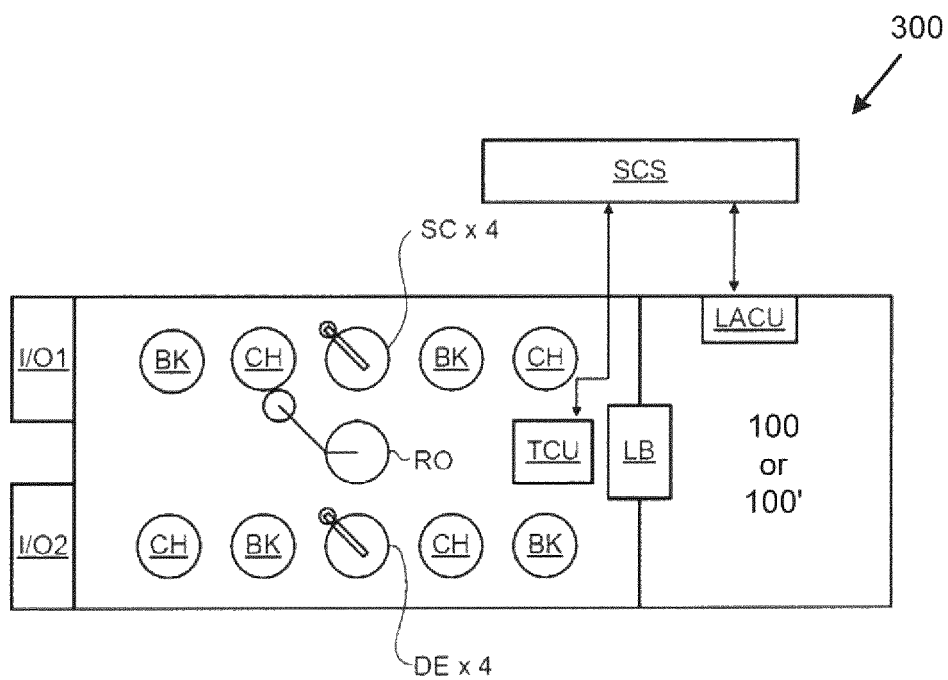
FIG. 3 is an illustration of a lithographic cell, according to an embodiment.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Example Metrology System

Figure 4:
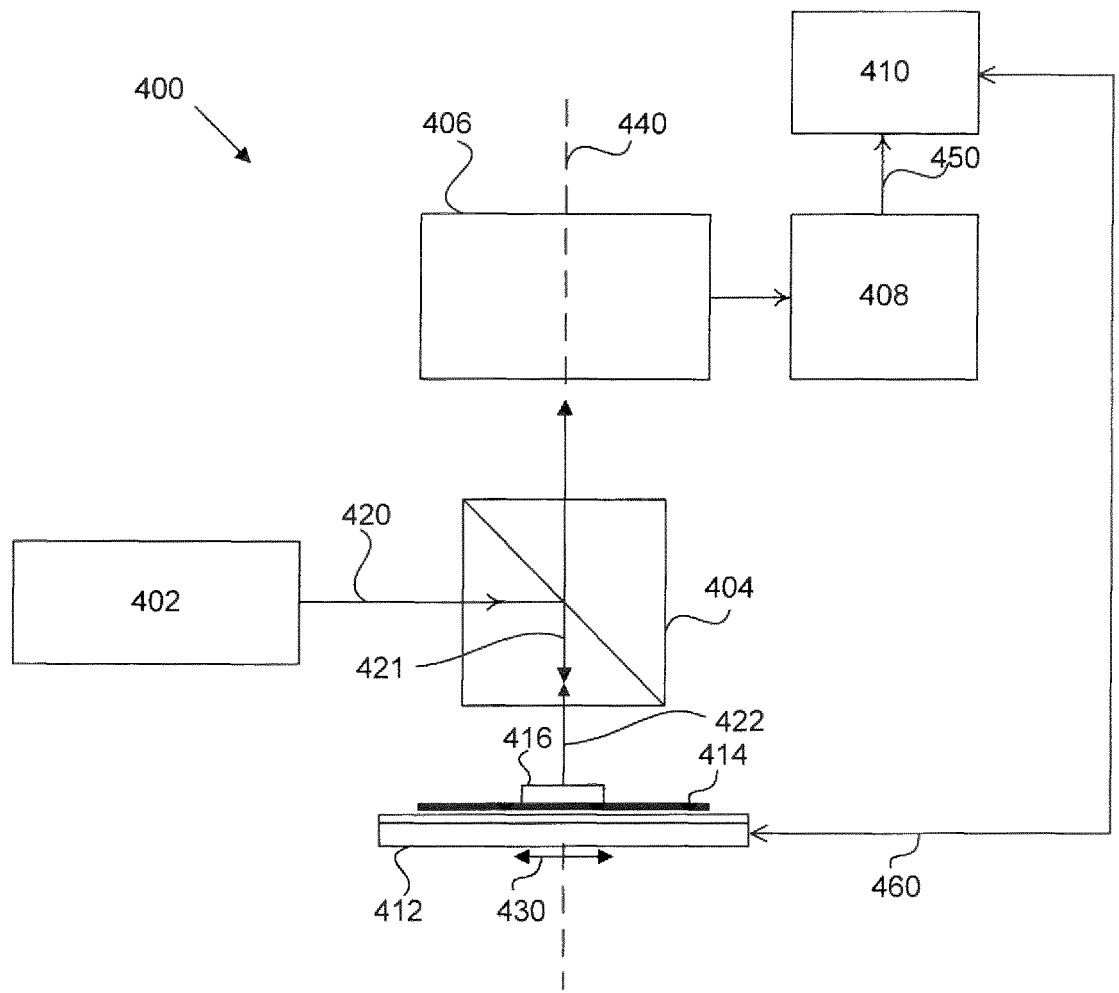
FIG. 4 is an illustration of a metrology system, according to an embodiment.

FIG. 4 illustrates a metrology system 400 that can be implemented as a part of lithographic apparatus 100 or 100', according to an embodiment. In an example of this embodiment, metrology system 400 may be configured to align a substrate (e.g., substrate W) with respect to a patterning device (e.g., patterning device MA). Metrology system 400 may be further configured to detect positions of alignment marks on the substrate and to align the substrate with respect to the patterning device or other components of lithography apparatus 100 or 100' using the detected positions of the alignment marks. Such alignment of the substrate may ensure accurate exposure of one or more patterns on the substrate.

According to an embodiment, metrology system 400 may include an illumination system 402, a beam splitter 404, an interferometer 406, a detector 408, and a controller 410. Metrology system 400 may also include a support 412 that is configured to support a substrate 414 that may include a target 416. In some embodiments, support 412 may move in either direction of arrow 430.

In one embodiment, illumination system 402 may be configured to provide a beam 420. Beam 420 may have one or more passbands. In an example, the one or more passbands may be between about 500 nm to about 900 nm. In some examples, the one or more passbands include near-infrared wavelengths. In some examples, the one or more passbands include both near-infrared and far-infrared wavelengths. The one or more passbands may be between about 500 nm and about 15 μm. Illumination system 402 may be further configured to provide one or more passbands having substantially constant center wavelength (CWL) values over a long period of time (e.g., over a lifetime of illumination system 402). Such configuration of illumination system 402 may help to prevent the shift of the actual CWL values from the desired CWL values, as discussed above, in current metrology systems. And, as a result, the use of constant CWL values may improve long-term stability and accuracy of metrology systems (e.g., metrology system 400) compared to the current metrology systems.

In one embodiment, beam splitter 404 may be configured to receive radiation beam 420. Beam splitter 404 directs at least a portion of beam 420 (hereafter referred to as beam 421) towards substrate 414 and/or an alignment mark or target 416 (hereinafter target 416). Beam splitter 404 may also direct another portion of beam 420 towards interferometer 406 to act as a reference beam. In this example, either substrate 414 or target 416 can be in the light path of beam 421. In one embodiment, beam 421 may either reflect or diffract from substrate 414 and/or target 416, forming reflected or diffracted beam 422. In this embodiment, beam 422 passes through beam splitter 404 to be received by interferometer 406.

In one embodiment, target 416 may have one hundred and eighty degree symmetry. That is, when target 416 is rotated one hundred and eighty degrees about an axis of symmetry perpendicular to a plane of target 416, rotated target 416 may be substantially identical to an un-rotated target 416.

In one embodiment, interferometer 406 comprises optical-elements, for example, a combination of prisms that may be configured to form two images of target 416 based on the received radiation beam 422 and the reference beam from beam splitter 404. It should be appreciated that a good quality image need not be formed, but that the features of target 416 should be resolved. Interferometer 406 may be further configured to rotate one of the two images with respect to the other of the two images one hundred and eighty degrees and recombine the two images interferometrically.

In an embodiment, detector 408 may be configured to receive the recombined image and detect an interference as a result of the recombined image when alignment axis 440 of metrology system 400 passes through a center of symmetry (not shown) of target 416. Such interference may be due to target 416 being one hundred and eighty degree symmetrical, and the recombined image interfering constructively or destructively, according to an example embodiment. Based on the detected interference, detector 408 may be further configured to determine a position of the center of symmetry of target 416 and consequently, detect a position of substrate 414. According to an example, alignment axis 440 may be aligned with an optical beam perpendicular to substrate 414 and passing through a center of image rotation interferometer 406. In another example, detector 408 is configured to receive the recombined image and detect an interference of light being reflected off a surface of substrate 414.

In one embodiment, controller 410 may be configured to receive signal 450 including information of the determined center of symmetry. Controller 410 may be further configured to determine a position of support 412 and correlate the position of support 412 with the position of the center of symmetry of target 416. As such, the position of target 416 and consequently, the position of substrate 414 may be accurately known with reference to support 412.

In one embodiment, controller 410 may be configured to determine a position of metrology system 400 or any other reference element such that the center of symmetry of alignment mark or target 416 may be known with reference to metrology system 400 or any other reference element. Based on the determined position of metrology system 400 or of target 416, controller 410 may provide an activation signal 460 to one or more actuators (not shown) designed to move support 412 as indicated by arrow 430. Support 412 may be moved in this way to align target 416 with alignment axis 440 of metrology system 400, or to move target 416 to any other desired position.

In one embodiment, controller 410 is configured to apply a correction to a measurement received from detector 408 to account for asymmetry that can exist in alignment mark or target 416. The asymmetry can exist due to imperfections in the structure of the mark itself (sidewall angle, critical dimension spacing, etc.) or due to non-linear optical effects based on the wavelength of light being directed towards alignment mark or target 416. Controller 410 may also correct for any noise in the received signal 450.

It should be noted that even though beam splitter 404 is shown to direct beam 420 towards alignment mark or target 416, the disclosure is not so limiting. It would be apparent to a person skilled in the relevant art that other optical arrangements may be used to obtain the similar result of illuminating alignment mark or target 416 on substrate 414 and detecting an image of alignment mark or target 416. Beam splitter 414 may direct the illumination in a direction normal to the surface of substrate 414, or at an angle.

Noise Correction Embodiments

As noted above, a correction may be applied to measurements taken from metrology system 400 to account for noise in the received signal 450. In some noise correction techniques, the signal values from the constructive (sum) channel and destructive (diff) channel of the interferometer output are plotted as scattered data points. A best fit line is calculated for the scattered data points to minimize the mutual noise between the two channels using a least squares regression (LSR) technique. However, LSR assumes that one of the two channels is free of any noise while only the other channel includes any noise variation. As this assumption is rarely, if ever, correct, the noise is not entirely accounted for using this technique.

According to an embodiment, a noise correction technique is provided that uses the assumption that both the sum and diff channels from the interferometer include noise variation. The new noise correction technique includes a true physical assumption for development of the mathematical formulation that applies the right choice of error variation between alignment intensity channels that minimize effectively the mutual noise in the sum and diff channels of the interferometer. The mathematical formulation applies a correct distance to be minimized based on physical context of the data, and this data driven approach is able to model the signal variation moving forward in time.

Each of the sum (ys) and diff (yd) channels from the interferometer output are first each assumed to have a different random error associated with them as shown in equation 1 below, $$ys = x + e_1 \quad e_1 \sim N(0, \sigma_1^2) \text{ sum channel}$$

$$yd = y + e_2 \quad e_2 \sim N(0, \sigma_2^2) \text{ diff channel} \quad (1)$$

Where $e_1$ and $e_2$ are the independent mean zero random error variables with variances $\sigma_1^2$ and $\sigma_2^2$ applied to the sum (ys) and diff (yd) channels respectively. Variables x and y are related through a theoretical linear regression model described in equation 2, $$y = g_{ac} x + \beta \quad (2)$$

where $g_{ac}$ and $\beta$ are slope and intercept of a straight line. Given a set of n measured data points $(ys_i, yd_i)$, variances Sxx, Syy and covariance cov(ys, yd) can be expressed in a matrix form, $$Sxx = \frac{1}{n} \sum_{i=1}^{n} (ys_i - \overline{ys})^2 = \frac{1}{n} \sum_{i=1}^{n} (ys_i^2 - \overline{ys}^2) \quad (3)$$

$$Syy = \frac{1}{n} \sum_{i=1}^{n} (yd_i - \overline{yd})^2 = \frac{1}{n} \sum_{i=1}^{n} (yd_i^2 - \overline{yd}^2)$$

$$cov(ys, yd) =$$

$$Sxy = \frac{1}{n} \sum_{i=1}^{n} (ys_i - \overline{ys})(yd_i - \overline{yd}) = \frac{1}{n} \sum_{i=1}^{n} ys_i \cdot yd_i - \overline{ys} \cdot \overline{yd}$$

where mean values $\overline{ys}$ and $\overline{yd}$ are defined as $$\overline{ys} = \frac{1}{n} \sum_{i=1}^{n} ys_i \quad (4)$$

$$\overline{yd} = \frac{1}{n} \sum_{i=1}^{n} yd_i$$

and also follow the relationship expressed in equation 2, such that $$\overline{yd} = g_{ac} \overline{ys} + \beta \quad (5)$$

Statistical methods can be used to determine an estimate of the slope $g_{ac}$ and the intercept $\beta$ based on minimizing a statistical distance from the line to the measured data points. According to an embodiment of the present disclosure, linear regression methods include a general analysis considering random variations from both variables ys and yd, as well as special applications considering the noise variations for lithography alignments.

In some embodiments, a general analysis technique, for example, principal component analysis (PCA) can be used to find a mathematical estimation of the slope $g_{ac}$ and the intercept $\beta$. The PCA algorithm can be summarized as follows. First, the measured data points $(ys_i, yd_i)$ can be organized into a matrix Z. In some embodiments, matrix Z can be centered and standardized with mean of zero and standard deviation of 1. Next, $Z^T Z$, a covariance matrix of Z, can be calculated by multiplying matrix Z with its transposed matrix $Z^T$. Accordingly, each element of covariance matrix $Z^T Z$ includes information from the measured data points $(ys_i, yd_i)$. Through computing eigenvectors V and their corresponding eigenvalues $\omega_i$ (i=1, 2, ... n), matrix $Z^T Z$ can be decomposed into $VDV^{-1}$, wherein matrix D is a diagonal matrix with eigenvalues $\omega_i$ on the diagonal and values of zero everywhere else. A similar calculation can be repeated to find eigenvectors U and their corresponding eigenvalues $\gamma_i$ of matrix $ZZ^T$, another covariance matrix of Z.

According to singular value decomposition (SVD) theorem, matrix $Z = USV^T$, wherein matrix S is diagonal and includes singular values of square roots of $\omega_i \gamma_i$, and eigenvectors U and V, are orthogonal. Using SVD, an orthogonal subspace (coordinate system) can be generated to convert the measured data points $(ys_i, yd_i)$ into a set of uncorrelated orthogonal values $(ys_i^*, yd_i^*)$. The matrix S can be rearranged with singular values in a descending order along with eigenvectors U and $V^T$. Dimensionality reduction then can be performed according to the magnitude of the singular values, wherein a subset of the components with the largest singular values (i.e., largest possible variance) can be chosen in the subsequent regression computation of the slope $g_{ac}$ and the intercept $\beta$.

The PCA and SVD methods can be effective statistical tools based on the circumstance that each of the transformed values $(ys_i^*, yd_i^*)$ can be a weighted combination of all the measured data points $(ys_i, yd_i)$. Therefore at dimensionality reduction, a least important subset of transformed values $(ys_i^*, yd_i^*)$ can be eliminated without losing characteristics of the measured data points $(ys_i, yd_i)$. The PCA and SVD methods also include an important property of eigenvalue and eigenvectors, wherein eigenvectors represent "directions" and eigenvalues represent "magnitude" or "importance." Therefore, larger eigenvalues point to the more important directions. In the present disclosure for noise characterization of a lithography alignment system, the PCA and SVD method further includes an assumption that larger eigenvalues correspond to more behaviour information of the measured data points $(ys_i, yd_i)$, e.g., larger possible variance.

The PCA and SVD methods can be statistical analysis tools for any general application. In a situation having a large data set with a requirement for a fast computation result, simplified approaches can be used to provide reasonable estimations of the slope $g_{ac}$ with analytic expressions.

In another example, a maximum likelihood (ML) approach is used to determine the optimal signal using the similarity between the data received from the sum and diff channels and minimizing an error function between them, wherein the error function can be compared to the statistic distance in linear regression analysis. Assuming measured data points $(ys_i, yd_i)$ can be independently distributed according to bivariate normal distribution described in equation 1, a probability density function $f$ can be described as $$f(ys, yd \mid \sigma_1^2, \sigma_2^2) = \prod_{i=1}^{n} \frac{1}{\sigma_1 \sqrt{2\pi}} \quad (6)$$

$$\exp\left(-\frac{1}{2}\left[\frac{ys_i - \overline{ys}}{\sigma_1}\right]^2\right) \prod_{i=1}^{n} \frac{1}{\sigma_2 \sqrt{2\pi}} \exp\left(-\frac{1}{2}\left[\frac{yd_i - \overline{yd}}{\sigma_2}\right]^2\right)$$

wherein the probability density function can be further expressed with parameters of $g_{ac}$ and $\beta$ using the relationship in equation 5. A likelihood function L can be defined by reversing the variable dependency in the probability density function $f$, i.e., $L(\sigma_1^2, \sigma_2^2, g_{ac}, \beta | ys, yd)$. The likelihood function L represents the likelihood of the parameters given the measured data points and model of the probability density function. The ML method determines a set of parameters that can maximize the likelihood function L. In the other words, ML estimation is a method to seek the probability distribution that makes the measured data points most likely. For computation purpose, a log-likelihood function can be maximized because the log-likelihood function and likelihood function are monotonically related. By solving partial differential equations known as the likelihood equations, $$\frac{\partial \mathrm{Ln}\, L(\sigma_1^2, \sigma_2^2, gac, \beta \mid ys, yd)}{\partial g_{ac}} = 0 \quad (7)$$

$$\frac{\partial \mathrm{Ln}\, L(\sigma_1^2, \sigma_2^2, gac, \beta \mid ys, yd)}{\partial \beta} = 0$$

$$\frac{\partial \mathrm{Ln}\, L(\sigma_1^2, \sigma_2^2, gac, \beta \mid ys, yd)}{\partial \sigma_1^2} = 0$$

$$\frac{\partial \mathrm{Ln}\, L(\sigma_1^2, \sigma_2^2, gac, \beta \mid ys, yd)}{\partial \sigma_2^2} = 0$$

the general form of the slope ($g_{ac}$) generated from maximum likelihood estimation is shown below in equation 8.

$$g_{ac} = \frac{S_{yy} - S_{xx} + \sqrt{(S_{yy} - S_{xx})^2 + 4\lambda S_{xy}^2}}{2S_{xy}} \quad (8)$$

In this example, an assumption is made that the ratio of the two variances of sum and diff channels can be known as $$\lambda = \frac{\sigma_2}{\sigma_1} \quad (9)$$

In equation 8, another assumption is made that the two variances $\sigma_1^2$ and $\sigma_2^2$ of the sum and diff channels are independent.

In a special situation when the two variances $\sigma_1^2$ and $\sigma_2^2$ of the sum and diff channels are identical, i.e., $\lambda=1$, the slope of the linear regression line can be expressed as $$g_{ac} = \frac{S_{yy} - S_{xx} + \sqrt{(S_{yy} - S_{xx})^2 + 4S_{xy}^2}}{2S_{xy}} \quad (10)$$

Figure 5:
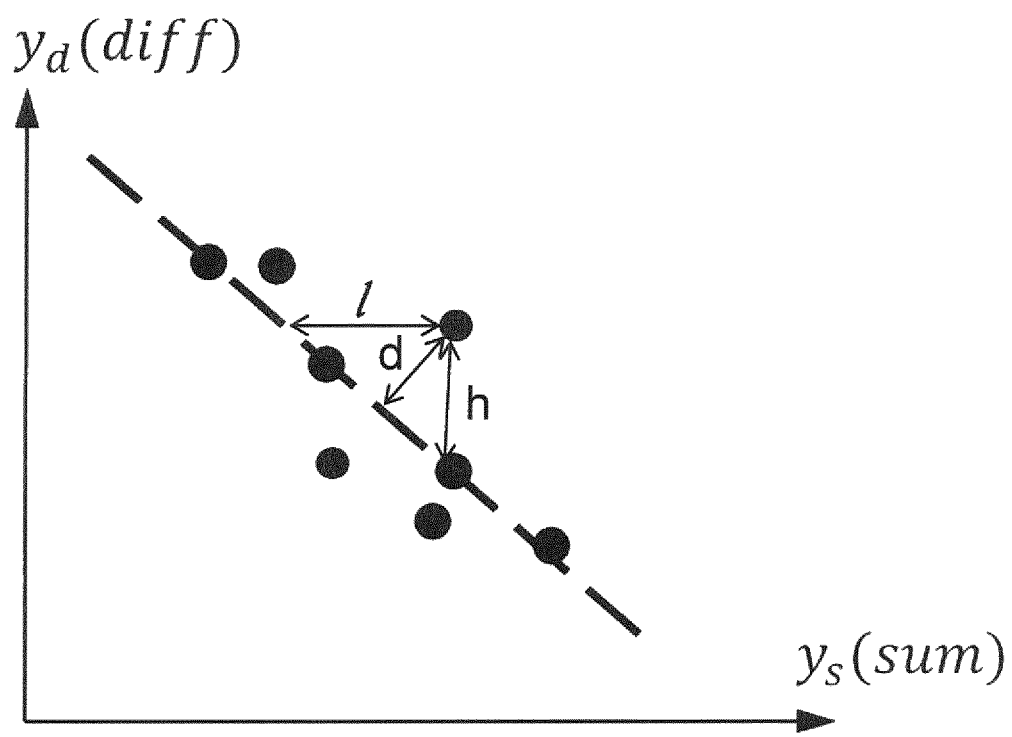
FIG. 5 is an illustration characterizing measured data, according to an embodiment.

The slope $g_{ac}$ in equation 10 also refers to a slope of an orthogonal regression and can be derived from minimizing an orthogonal distance d from the measurement data point to the line. An exemplary model is illustrated in FIG. 5. In this example, the statistical distance is equivalent to the orthogonal distance d, as opposed to a vertical distance h in an ordinary least square estimate. The orthogonal distances d from the measured data points to the line can be represented by $$d^2 = \Sigma_{i=1}^{n}[(ys_i - x_i)^2 + (yd_i - y_i)^2] \quad (11)$$

wherein ($ys_i$, $yd_i$) are the measured data points and ($x_i$, $y_i$) are the corresponding closest points on the regression line (equation 2). The slope $g_{ac}$ in equation 10 can be derived using partial differential equations $$\frac{\partial d^2}{\partial g_{ac}} = \frac{\partial d^2}{\partial \beta} = 0,$$

and the technique is known to those skilled in the art.

The slope $g_{ac}$ in equation 8 can be simplified for ordinary least square estimate of yd on ys, where vertical distance h can be minimized. In this example, $$\lambda = \infty \text{ and } g_{ac} = \frac{S_{xy}}{S_{xx}} \quad (12)$$

The slope $g_{ac}$ in equation 8 can also be simplified for ordinary least square estimate of ys on yd, where horizontal distance l can be minimized. In this example, $$\lambda = 0 \text{ and } g_{ac} = \frac{S_{yy}}{S_{xy}} \quad (13)$$

In order to calculate a best fit line to the scattered data plot, for each data point there are two vertical and horizontal residuals which need to be minimized in the fitting model. The ML estimation technique chooses a best fit line (equation 8) that minimizes the residual in both the x and y directions under the condition that the ratio of two variances $\lambda$ is known.

There are situations that variations from sum ys and diff yd channels have different randomness and the randomness is only caused by the random error in each channel ($e_1$ and $e_2$ from equation 1). Also, there is no basis for distinguishing between the independent and dependent variables, such as yd and ys. In this example, geometric mean estimation can be used for the regression analysis. Equation 14 takes the geometric mean of the slope of the sum channel ys on the diff channel yd regression line (equation 13), and the reciprocal of the slope of the diff channel yd on the sum channel ys regression line (equation 12). The calculated slope can then be applied to generate the best fit line to the plotted data in the orthogonal subspace using equation 15.

$$g_{ac} = \mathrm{sign}(S_{xy}) \sqrt{\frac{S_{yy}}{S_{xx}}} \quad (14)$$

$$y_d - \overline{y_d} = g_{ac}(y_s - \overline{y_s}) \quad (15)$$

Wherein $\mathrm{sign}(S_{xy})$ is a sign function, determined by the covariance $S_{xy}$. Because of the physical relationship with the interferometer, the $\mathrm{sign}(S_{xy})$ of sum channel ys and diff channel yd is typically negative. Substituting variances $S_{xx}$ and $S_{xy}$ from equation 3, $g_{ac}$ in equation 14 can be rewritten as $$g_{ac} = \sqrt{\frac{\sum_{i=1}^{n}(y_{d,i} - \overline{y_d})^2}{\sum_{i=1}^{n}(y_{s,i} - \overline{y_s})^2}} \quad (16)$$

Geometric mean estimation can also be viewed as a special scenario of ML estimation in equation 8, if and only if $$\lambda = \frac{S_{yy}}{S_{xx}} \tag{17}$$

Once the best fit line to the plotted data in the orthogonal subspace has been determined (illustrated in FIG. 5), it may be used by controller 430 to determine alignment of the alignment mark(s) on the substrate.

Once the data has been plotted as a scatter plot in the generated orthogonal subspace, different sources of noise can be determined and quantified. The ability to characterize different noise contributions in the signal results in a corrected model or a noise free signal that can minimize the accuracy error. Examples of noise contributions that can be identified from the measured data include additive noise, multiplicative noise, and local phase variation.

Figure 6A:
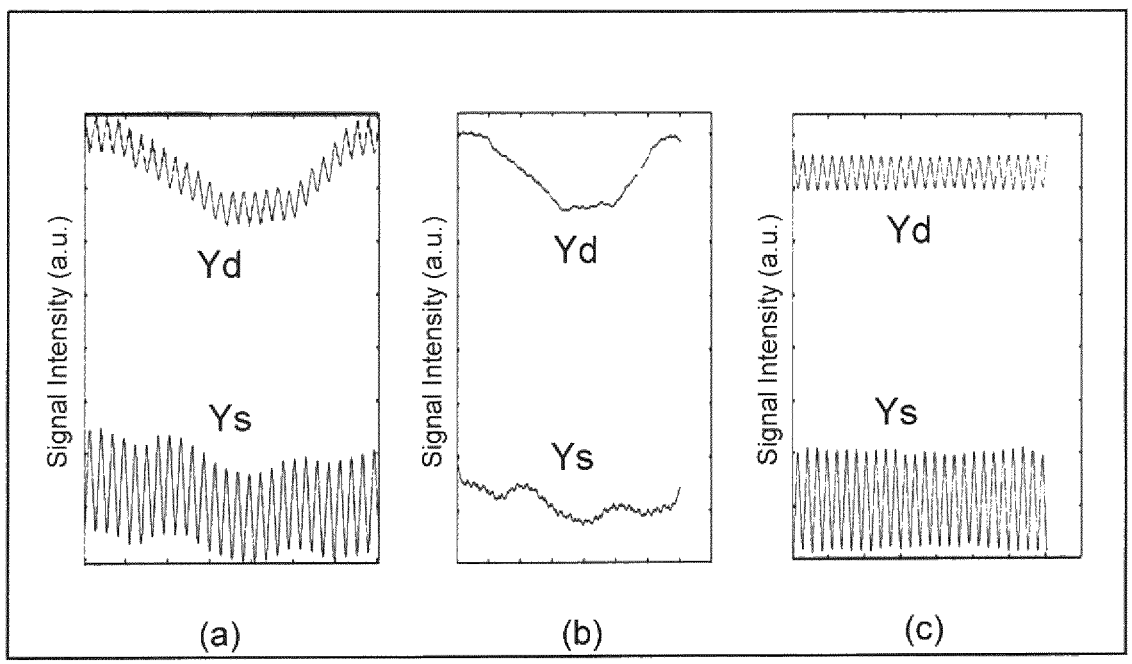
FIGS. 6A and 6B are illustrations characterizing measured data and illustrating measurement drift, according to an embodiment.

FIG. 6A illustrates signal intensities (also referred to as signal values) from the diff and sum channels (a) before and (c) after additive noise correction. In this example, the signals from the diff (yd) and sum (ys) channels are scanned many times during a repro experiment, wherein the signal intensity or amplitude of each channel show the influence from additive noise variations. Additive noise is characterized by the variation of mean signal of each channel, see graph (a). Unpredictable additive noise results in low repro performance. The mean signal of each channel can be extracted and is shown in graph (b). After subtracting the mean signal in graph (b), the signal intensity of each channel is shown in graph (c), wherein the signal of each channel having a constant mean value and is dominated by random noise variations.

Figure 6B:
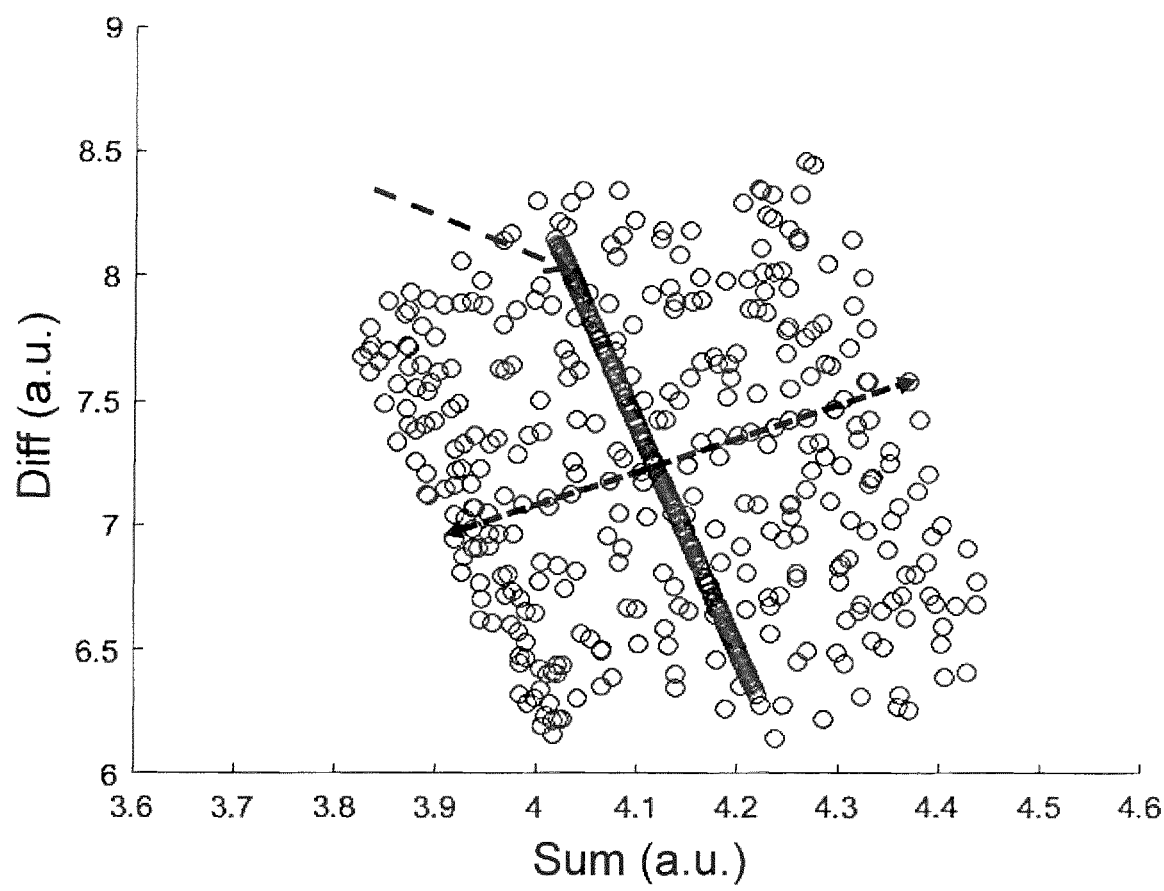

FIG. 6B shows scattered data points (open circles) of signal intensity from the diff channel as a function of the signal intensity from the sum channel. The fitted line (solid circles) can be calculated from the model described in this disclosure. In this example, the additive noise can be characterized directly from the fitted lines instead of using experimental data in FIG. 6A. The additive noise can be identified by the orthogonal distance from the scattered data points to the fitted line. Therefore, additive variation is also called drift variation, which is indicated by the dashed arrow line in FIG. 6B.

Quantitatively the orthogonal distance from the scattered data points to the fitted line can be calculated using a total least square coefficient of determination $R^2$. The total least square coefficient of determination $R^2$ determines the departure of the data points from the best fitted line (drift in sum and diff channel). The proportion of the orthogonal distance of data points to the fitted model quantifies the additive noise variation.

$$\text{Adjusted } R^2 = 1 - \frac{TLS_{res}}{TLS_{tot}} \tag{18}$$

wherein Adjusted $R^2$ is an adjusted total least square coefficient of determination in the orthogonal direction and $TLS_{res}$ and $TLS_{tot}$ are defined as $$TLS_{res} = \sum_{i=1}^{n} d((y_s^*, y_d^*)_i; (\overline{y_s}, \overline{y_d})_i)$$

$$TLS_{tot} = \sum_{i=1}^{n} d((y_s, y_d)_i; (\overline{y_s}, \overline{y_d})_i)$$

wherein $d(p_1, p_2)$ is the distance between two data points $p_1$ and $p_2$. Data point $(y_s, y_d)$ is a measured value. Data point $(y_s^*, y_d^*)$ corresponds to the point on the fitted line, while $(\overline{y_s}, \overline{y_d})$ stands for the mean value. In an ideal case, Adjusted $R^2=1$.

Figure 7:
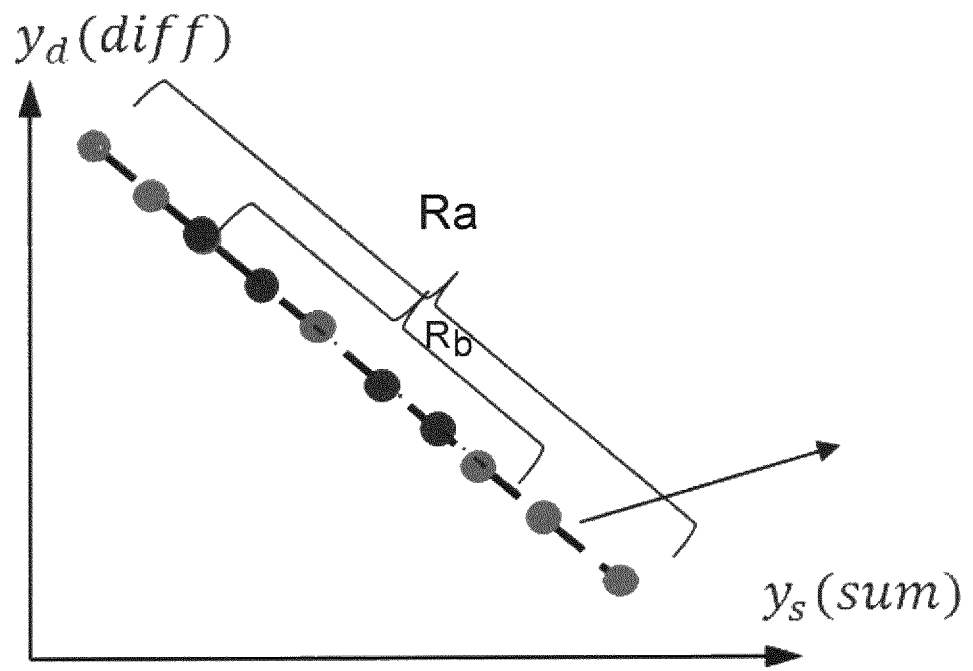
FIG. 7 is another illustration characterizing measured data and illustrating the effect of multiplicative noise, according to an embodiment.

FIG. 7 illustrates a data plot that shows the characteristics of multiplicative noise variations. Multiplicative noise is defined as the variation of signal amplitude of the diff and sum channels over multiple scans during a repro experiment. The signal amplitude variation in the scan results in variation of data range along the fitted model (orthogonal to drift distance). For example, FIG. 7 shows two data ranges $R_a$ and $R_b$. This variation is quantified along the fitted line to obtain amplitude variation as a key performance indicator (KPI) of each channel over the scan. Depending on the magnitude of the multiplicative noise variation, a confidence interval (CI) changes along the fitted line, where the confidence interval (CI) can be determined from the difference between the data ranges (e.g., $R_a$ and $R_b$.)

Figure 8:
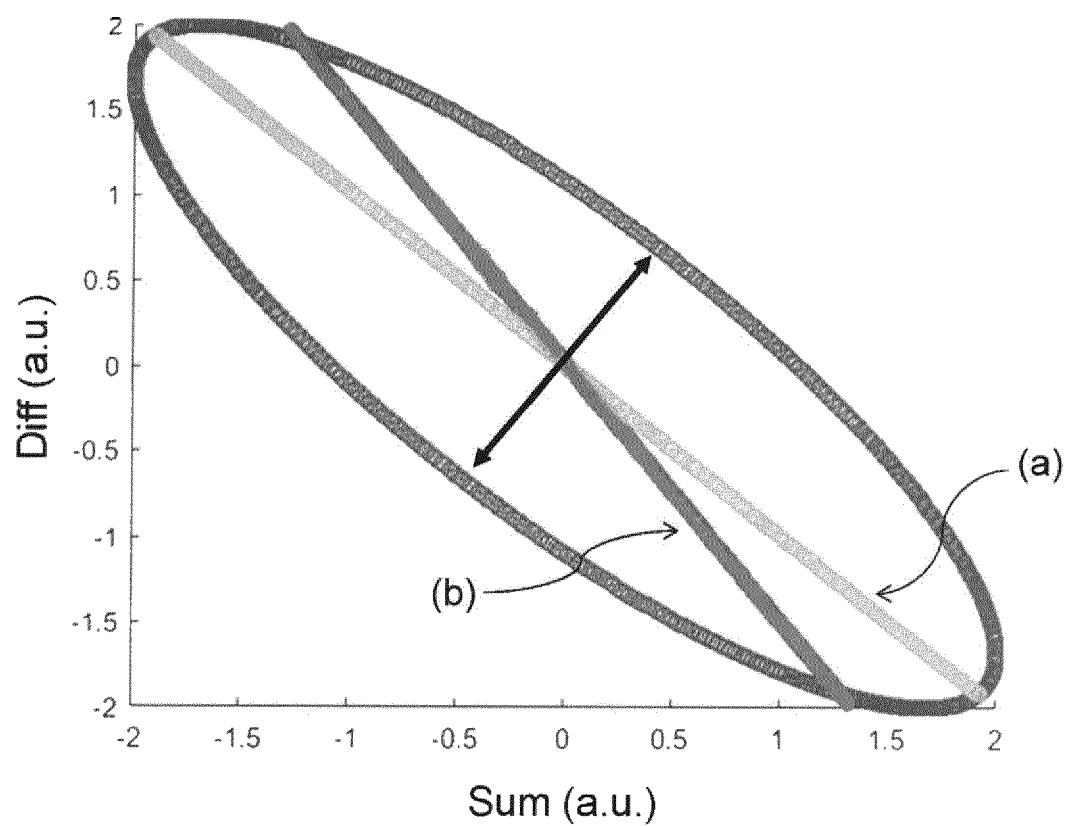
FIG. 8 is another illustration characterizing measured data and illustrating a phase distortion in the measurement, according to an embodiment.

FIG. 8 illustrates a plot of raw data (forming an elliptical pattern) along with a fitted line (a) generated using the current model along the longest axis of the ellipse. The elliptical pattern of the data is formed because of the phase difference between the sum and diff channels. The level of phase distortion is shown by the double ended black arrow as the orthogonal distance from the fitted line to the data along the other major axis of the ellipse. Also illustrated is the fitted line (b) generated using an older model. The phase distortion cannot be accurately determined using the older technique, because the fitted line is not aligned along the longest axis of the ellipse of data points.

Figure 9:
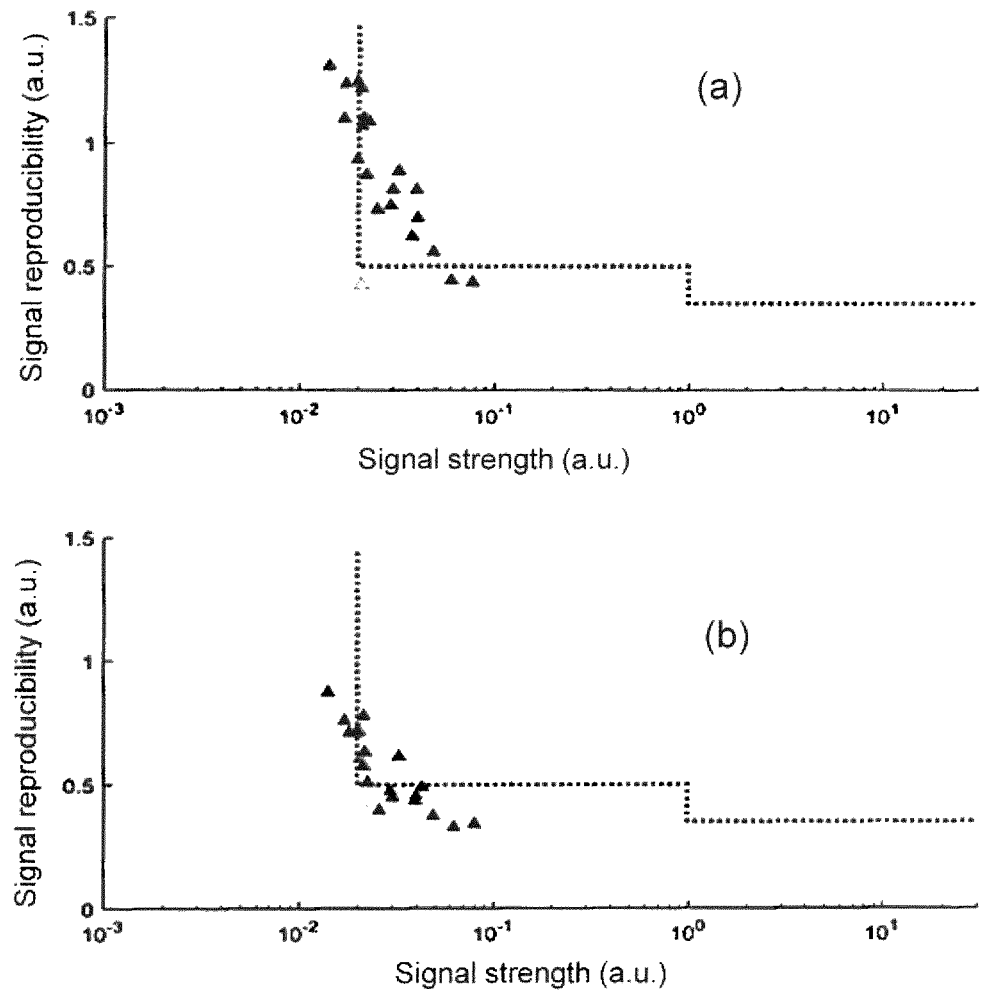
FIG. 9 is an illustration representing the effects of noise correction in the measured data, according to an embodiment.

FIG. 9 illustrates an exemplary application of noise cancellation, where measured data are plotted in scattered triangles and desired target values are plotted in dashed lines. The white source laser used as an example of the illumination system 412 has a high noise level, especially for green light. FIG. 9 shows the signal reproducibility (along the y-axis) in terms of signal strength (along the x-axis.) The same experiment is performed several times to record variation. While higher signal strength corresponds to lower variation, the distribution is relatively high, as shown in the top graph (a) for the green light. After using regression analysis on the measured data points, additive and multiplicative noise can be identified from the fitted lines and can be corrected accordingly. The variation of the green light is greatly improved post data analysis and noise cancelation as shown in the bottom graph (b). The scattering of the data is reduced and the total variation is reduced.

FIG. 10 illustrates a best fit line (a) being made to raw data (circular points) using the improved approach described herein (current model) compared to a fit line (b) from prior fitted approach (old model). As can be seen, the fitted line of the current model more closely represents the general shape of the data compared to the fitted line generated using the prior error correction technique.

FIG. 11 is a flowchart of an exemplary method 1100 of correcting errors from received measurements of an alignment mark, according to some embodiments. It should be understood that the operations shown in method 1100 are not exhaustive and that other operations can be performed as well before, after, or between any of the illustrated operations. In various embodiments of the present disclosure, the operations of method 1100 can be performed in a different order and/or vary.

In operation 1102, on optical measurement is collected from an alignment target on a substrate using an interferometer. The alignment target can be a grating structure having lines of a given width and thickness. The alignment mark on the target can be illuminated using light having a wavelength range between 500 nm and 900 nm.

In operation 1104, a controller is used to determine an orthogonal subspace to characterize the optical measurement collected from the alignment target. In one example, the orthogonal subspace is generated using singular value decomposition (SVD) of the data received from the sum and diff channels. In another example, a maximum likelihood (ML) approach is used to determine the optimal signal using the similarity between the data received from the sum and diff channels and minimizing an error function between them. When generating the orthogonal subspace, a first axis of the orthogonal subspace corresponds to constructive interference output from the interferometer plus a first error variable and the second axis of the orthogonal subspace corresponds to destructive interference output from the interferometer plus a second error variable.

In operation 1106, the slope of the data plotted in the orthogonal subspace is determined. The geometric mean of the slope of the sum channel on the diff channel regression line, and the reciprocal of the slope of the diff channel on the sum channel regression line can each be used when determining the corrected slope value.

In operation 1108, a fitted line is generated to fit the scatter plot of data in the orthogonal subspace. The fitted line uses the slope calculated in operation 1106 and can be represented by equation 8 discussed above. Once the best fit line to the plotted data in the orthogonal subspace has been determined, it may be used by a controller to determine alignment of the alignment mark(s) on a substrate.

Example Hardware Environment

Various embodiments described herein of correcting alignment overlay measurements can be implemented, for example, using one or more well-known computer systems, such as computer system 1200 shown in FIG. 12. Computer system 1200 can be any well-known computer capable of performing the functions described herein, such as computers available from International Business Machines, Apple, Sun, HP, Dell, Sony, Toshiba, etc. In one example, computer system 1200 represents controller 430. In another example, controller 430 is represented by a processor 1204 of computer system 1200. Computer system 1200 may be configured to perform any of operations 1102-1108 of method 1100, according to some embodiments.

Computer system 1200 includes one or more processors (also called central processing units, or CPUs), such as processor 1204. Processor 1204 is connected to a communication infrastructure or bus 1206.

One or more processors 1204 may each be a graphics processing unit (GPU). In an embodiment, a GPU is a processor that is a specialized electronic circuit designed to rapidly process mathematically intensive applications on electronic devices. The GPU may have a highly parallel structure that is efficient for parallel processing of large blocks of data, such as mathematically intensive data common to computer graphics applications, images and videos.

Computer system 1200 also includes user input/output device(s) 1203, such as monitors, keyboards, pointing devices, etc., which communicate with communication infrastructure 1206 through user input/output interface(s) 1202.

Computer system 1200 also includes a main or primary memory 1208, such as random access memory (RAM). Main memory 1208 may include one or more levels of cache. Main memory 1208 has stored therein control logic (i.e., computer software) and/or data. In an embodiment, at least main memory 1208 may be implemented and/or function as described herein.

Computer system 1200 may also include one or more secondary storage devices or memory 1210. Secondary memory 1210 may include, for example, a hard disk drive 1212 and/or a removable storage device or drive 1214. Removable storage drive 1214 may be a floppy disk drive, a magnetic tape drive, a compact disk drive, an optical storage device, tape backup device, and/or any other storage device/drive.

Removable storage drive 1214 may interact with a removable storage unit 1218. Removable storage unit 1218 includes a computer usable or readable storage device having stored thereon computer software (control logic) and/or data. Removable storage unit 1218 may be a floppy disk, magnetic tape, compact disk, DVD, optical storage disk, and/any other computer data storage device. Removable storage drive 1214 reads from and/or writes to removable storage unit 1218 in a well-known manner.

According to an exemplary embodiment, secondary memory 1210 may include other means, instrumentalities or other approaches for allowing computer programs and/or other instructions and/or data to be accessed by computer system 1200. Such means, instrumentalities or other approaches may include, for example, a removable storage unit 1222 and an interface 1220. Examples of the removable storage unit 1222 and the interface 1220 may include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computer system 1200 may further include a communication or network interface 1224. Communication interface 1224 enables computer system 1200 to communicate and interact with any combination of remote devices, remote networks, remote entities, etc. (individually and collectively referenced by reference number 1228). For example, communication interface 1224 may allow computer system 1200 to communicate with remote devices 1228 over communications path 1226, which may be wired and/or wireless, and which may include any combination of LANs, WANs, the Internet, etc. Control logic and/or data may be transmitted to and from computer system 1200 via communication path 1226.

In an embodiment, a tangible apparatus or article of manufacture comprising a tangible computer useable or readable medium having control logic (software) stored thereon is also referred to herein as a computer program product or program storage device. This includes, but is not limited to, computer system 1200, main memory 1208, secondary memory 1210, and removable storage units 1218 and 1222, as well as tangible articles of manufacture embodying any combination of the foregoing. Such control logic, when executed by one or more data processing devices (such as computer system 1200), causes such data processing devices to operate as described herein.

Based on the teachings contained in this disclosure, it will be apparent to persons skilled in the relevant art(s) how to make and use the invention using data processing devices, computer systems and/or computer architectures other than that shown in FIG. 12. In particular, embodiments may operate with software, hardware, and/or operating system implementations other than those described herein.

The embodiments may further be described using the following clauses:

1. A metrology system, comprising:
    a radiation source configured to generate light;
    a reflector configured to direct at least a portion of the light towards a substrate;
    an interferometer configured to receive light diffracted from a pattern on the substrate or reflected from the substrate, and to produce output light from interference generated based on the diffracted or reflected light;
    a detector configured to receive the output light and to produce a measurement; and
    a controller configured to determine a correction to the measurement by:
        determining an orthogonal subspace used to characterize the measurement as a plot of data, wherein a first axis of the orthogonal subspace corresponds to constructive interference output from the interferometer plus a first error variable and a second axis of the orthogonal subspace corresponds to destructive interference output from the interferometer plus a second error variable,
        determining a slope of the plot of data, and
        determining a fitted line to the plot of data in the orthogonal subspace based on the slope.

2. The metrology system of clause 1, wherein the controller determines the orthogonal subspace using singular value decomposition (SVD) of the constructive interference output and the destructive interference output.

3. The metrology system of clause 1, wherein the controller determines the orthogonal subspace using a maximum likelihood (ML) approach to minimize an error function between the constructive interference output and the destructive interference output.

4. The metrology system of clause 1, wherein the light generated by the radiation source has a wavelength range between 500 nm and 900 nm.

5. The metrology system of clause 1, wherein the controller is further configured to determine a magnitude of additive noise in the measurement based on a drift of the fitted line in the orthogonal subspace over time.

6. The metrology system of clause 1, wherein the controller is further configured to determine a magnitude of multiplicative noise in the measurement based on a variation in the slope over time.

7. The metrology system of clause 1, wherein the controller is configured to determine a phase distortion in the measurement based on a distance to the plot of data in a direction orthogonal to the fitted line in the orthogonal subspace.

8. A lithographic apparatus, comprising:
    an illumination system configured to illuminate a pattern of a patterning device;
    a projection system configured to project an image of the pattern onto a target portion of a substrate; and
    a metrology system comprising:
    a radiation source configured to generate light;
    a reflector configured to direct at least a portion of the light towards a substrate;
    an interferometer configured to receive light that has been diffracted from a pattern on the substrate, or reflected from the substrate, and to produce output light from interference generated based on the diffracted or reflected light;
    a detector configured to receive the output light and to produce a measurement; and
    a controller configured to determine a correction to the measurement by:
        determining an orthogonal subspace used to characterize the measurement as a plot of data, wherein a first axis of the orthogonal subspace corresponds to constructive interference output from the interferometer plus a first error variable and the second axis of the orthogonal subspace corresponds to destructive interference output from the interferometer plus a second error variable,
        determining a slope of the plot of data, and
        determining a fitted line to the plot of data in the orthogonal subspace based on the slope.

9. The lithographic apparatus of clause 8, wherein the controller determines the orthogonal subspace using singular value decomposition (SVD) of the constructive interference output and the destructive interference output.

10. The lithographic apparatus of clause 8, wherein the controller determines the orthogonal subspace using a maximum likelihood (ML) approach to minimize an error function between the constructive interference output and the destructive interference output.

11. The lithographic apparatus of clause 8, wherein the light generated by the radiation source has a wavelength range between 500 nm and 900 nm.

12. The lithographic apparatus of clause 8, wherein the controller is further configured to determine a magnitude of additive noise in the measurement based on a drift of the fitted line in the orthogonal subspace over time.

13. The lithographic apparatus of clause 8, wherein the controller is further configured to determine a magnitude of multiplicative noise in the measurement based on a variation in the slope over time.

14. The lithographic apparatus of clause 8, wherein the controller is configured to determine a phase distortion in the measurement based on a distance to the plot of data in a direction orthogonal to the fitted line in the orthogonal subspace.

15. A method of applying a correction to a measurement determined by a metrology system in order to account for multiple noise sources, the method comprising:
    determining an orthogonal subspace used to characterize the measurement as a plot of data, wherein a first axis of the orthogonal subspace corresponds to constructive interference output from an interferometer of the metrology system plus a first error variable and the second axis of the orthogonal subspace corresponds to destructive interference output from the interferometer of the metrology system plus a second error variable;
    determining a slope of the plot of data; and
    determining a fitted line to the plot of data in the orthogonal subspace based on the slope.

16. The method of clause 15, wherein determining the orthogonal subspace comprises using singular value decomposition (SVD) of the constructive interference output and the destructive interference output.

17. The method of clause 15, wherein determining the orthogonal subspace comprises using a maximum likelihood (ML) approach to minimize an error function between the constructive interference output and the destructive interference output.

18. The method of clause 15, further comprising determining a magnitude of additive noise in the measurement based on a drift of the fitted line in the orthogonal subspace over time.

19. The method of clause 15, further comprising determining a magnitude of multiplicative noise in the measurement based on a variation in the slope over time.

20. The method of clause 15, further comprising determining a phase distortion in the measurement based on a distance to the plot of data in a direction orthogonal to the fitted line in the orthogonal subspace.

Final Remarks

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target Figportion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation," "beam," and "light" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: C-line 436 nm; H-line 405 nm; and/or, Mine 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A metrology system, comprising:
a radiation source configured to generate light;
a reflector configured to direct at least a portion of the light towards a substrate;
an interferometer configured to receive light diffracted from a pattern on the substrate or reflected from the substrate, and to produce output light from interference generated based on the diffracted or reflected light;
a detector configured to receive the output light and to produce a measurement; and a controller configured to determine a correction to the measurement by:
  determining an orthogonal subspace used to characterize the measurement as a plot of data, wherein a first axis of the orthogonal subspace corresponds to constructive interference output from the interferometer plus a first error variable and a second axis of the orthogonal subspace corresponds to destructive interference output from the interferometer plus a second error variable,
  determining a slope of the plot of data, and
  determining a fitted line to the plot of data in the orthogonal subspace based on the slope.

2. The metrology system of claim 1, wherein the controller determines the orthogonal subspace using singular value decomposition (SVD) of the constructive interference output and the destructive interference output.

3. The metrology system of claim 1, wherein the controller determines the orthogonal subspace using a maximum likelihood (ML) approach to minimize an error function between the constructive interference output and the destructive interference output.

4. The metrology system of claim 1, wherein the light generated by the radiation source has a wavelength range between 500 nm and 900 nm.

5. The metrology system of claim 1, wherein the controller is further configured to determine a magnitude of additive noise in the measurement based on a drift of the fitted line in the orthogonal subspace over time.

6. The metrology system of claim 1, wherein the controller is further configured to determine a magnitude of multiplicative noise in the measurement based on a variation in the slope over time.

7. The metrology system of claim 1, wherein the controller is configured to determine a phase distortion in the measurement based on a distance to the plot of data in a direction orthogonal to the fitted line in the orthogonal subspace.

8. A lithographic apparatus, comprising:
  an illumination system configured to illuminate a pattern of a patterning device;
  a projection system configured to project an image of the pattern onto a target portion of a substrate; and
  a metrology system comprising:
    a radiation source configured to generate light;
    a reflector configured to direct at least a portion of the light towards a substrate;
    an interferometer configured to receive light that has been diffracted from a pattern on the substrate, or reflected from the substrate, and to produce output light from interference generated based on the diffracted or reflected light;
    a detector configured to receive the output light and to produce a measurement; and
    a controller configured to determine a correction to the measurement by:
      determining an orthogonal subspace used to characterize the measurement as a plot of data, wherein a first axis of the orthogonal subspace corresponds to constructive interference output from the interferometer plus a first error variable and the second axis of the orthogonal subspace corresponds to destructive interference output from the interferometer plus a second error variable,
      determining a slope of the plot of data, and
      determining a fitted line to the plot of data in the orthogonal subspace based on the slope.

9. The lithographic apparatus of claim 8, wherein the controller determines the orthogonal subspace using singular value decomposition (SVD) of the constructive interference output and the destructive interference output.

10. The lithographic apparatus of claim 8, wherein the controller determines the orthogonal subspace using a maximum likelihood (ML) approach to minimize an error function between the constructive interference output and the destructive interference output.

11. The lithographic apparatus of claim 8, wherein the light generated by the radiation source has a wavelength range between 500 nm and 900 nm.

12. The lithographic apparatus of claim 8, wherein the controller is further configured to determine a magnitude of additive noise in the measurement based on a drift of the fitted line in the orthogonal subspace over time.

13. The lithographic apparatus of claim 8, wherein the controller is further configured to determine a magnitude of multiplicative noise in the measurement based on a variation in the slope over time.

14. The lithographic apparatus of claim 8, wherein the controller is configured to determine a phase distortion in the measurement based on a distance to the plot of data in a direction orthogonal to the fitted line in the orthogonal subspace.

* * * * *

UNITED STATES PATENT AND TRADEMARK OFFICE
CERTIFICATE OF CORRECTION

PATENT NO. : 11,493,852 B2
APPLICATION NO. : 17/415711
DATED : November 8, 2022
INVENTOR(S) : Dastouri et al.

It is certified that error appears in the above-identified patent and that said Letters Patent is hereby corrected as shown below:

In the Specification

In Column 22, Line 4, delete "C-line" and replace with --G-line--;

In Column 22, Line 5, delete "Mine" and replace with --I-line--.

Signed and Sealed this
Twenty-fifth Day of June, 2024

*Katherine Kelly Vidal*

Katherine Kelly Vidal
*Director of the United States Patent and Trademark Office*